United States Patent [19]

Unagami et al.

[11] Patent Number: 4,528,480

[45] Date of Patent: Jul. 9, 1985

[54] AC DRIVE TYPE ELECTROLUMINESCENT DISPLAY DEVICE

[75] Inventors: Takashi Unagami, Katsuta; Bunjiro Tsujiyama, Mito, both of Japan

[73] Assignee: Nippon Telegraph & Telephone, Tokyo, Japan

[21] Appl. No.: 454,008

[22] Filed: Dec. 28, 1982

[30] Foreign Application Priority Data

Dec. 28, 1981 [JP] Japan .................. 56-215038
Nov. 29, 1982 [JP] Japan .................. 57-209123

[51] Int. Cl.³ .............. H05B 37/00; H05B 39/00; H05B 41/00
[52] U.S. Cl. .................... 315/169.1; 340/825.81; 340/825.91; 313/505; 315/51; 315/169.3; 357/23.1
[58] Field of Search ........... 315/51, 169.1, 169.3; 313/505, 499, 498; 357/23 TF, 23 HV; 340/825.81, 825.91

[56] References Cited

U.S. PATENT DOCUMENTS

| | | | |
|---|---|---|---|
| 3,909,306 | 9/1975 | Sakamoto et al. | 357/23 HV |
| 4,006,383 | 2/1977 | Luo et al. | 315/169.3 |
| 4,042,854 | 8/1977 | Luo et al. | 315/51 |
| 4,087,792 | 5/1978 | Asars | 315/169.3 |
| 4,344,080 | 8/1982 | Tihanyi | 357/23 HV |
| 4,394,674 | 7/1983 | Sakuma et al. | 357/23 HV |

OTHER PUBLICATIONS

"Thin-Film-Transistor Switching Matrix for Flat-Panel Displays" by G. Kramer; IEEE Transaction on Electron Devices, vol. ED-22, No. 9, pp. 733-739, Sep. 1975.

"A 6×6-in 20-lpi Electroluminescent Display Panel" by T. P. Brody et al., IEEE Transactions on Electron Devices, vol. ED-22, No. 9, Sep. 1975.

Primary Examiner—Saxfield Chatmon
Attorney, Agent, or Firm—Townsend and Townsend

[57] ABSTRACT

The AC drive type electroluminescent display device comprises a combination of an electroluminescent element, a transistor for driving the electroluminescent element, a source of alternating current, a switching transistor ON/OFF—controlling the first mentioned transistor, and a capacitor. The transistor for driving the electroluminescent element comprises a channel region of a first conductivity type and made of polycrystalline silicon with its grain size increased, first and second impurity diffused layers on the opposite sides of the channel region and a gate electrode overlying a predetermined portion of the channel region via a gate insulating film. The gate electrode is made of polycrystalline silicon diffused with an impurity of a second conductivity type. Offset gate regions are formed between the gate electrode and the first and second impurity diffused layers respectively.

8 Claims, 14 Drawing Figures (50 V/div)

(20 V/div)

AC DRIVE TYPE ELECTROLUMINESCENT DISPLAY DEVICE

BACKGROUND OF THE INVENTION

This invention relates to an AC drive type electroluminescent display device.

Various types of the display devices of the type described above have been developed for many years, but they still involve many problems to be solved. To obviate these difficulties, a display device utilizing an AC drive type electroluminescent display device has recently been developed capable of increasing the number of picture elements as well as the density, thereby preventing flickering and decrease in the brightness. Usually, the electroluminescent display device comprises a plurality of electroluminescent elements arranged in a matrix on a transparent substrate and transistors for driving the electroluminescent elements are provided corresponding to respective elements. Transistors corresponding to the electroluminescent elements to be operated are selectively driven to cause the elements to luminesce for displaying desired patterns, digits or letters. The transistors for driving the electroluminescent elements are required to be formed on a transparent substrate such as a glass panel and to have a high breakdown voltage characteristic. For this reason, thin film transistors utilizing as their semiconductor layers such binary compounds as CdSe, CdS, etc. have been generally used. Such transistors are described, for example in T. P. Brody et al paper entitled "A 6×6-in 20-lpi Electroluminscent Display Panel; I.E.E.E. Transactions ON Electron Device, Vol. ED-22, No. 9, September 1975.

Thin film transistors utilizing such binary compounds have a high mobility of the carriers, and a high breakdown voltage characteristic so that they are suitable for use in the display device of the type described above, but still accompany various problems as follows.

The binary compound semiconductors utilized in the thin film transistors lack stability of the characteristic, reliability over a long period, and the uniformity of the characteristics of the substrate. These factors cause a short life of the resulting thin film transistors. To obviate these difficulties, it has been proposed to perform all manufacturing steps in vacuum. Even with such measure, however, the characteristics of the thin film transistors vary with time. Typical examples of such characteristics are shown in FIG. 4. At present, it is considered that the instability of the characteristics of the binary compound semiconductors is caused by their stoichiometric compositions.

Furthermore, the binary compound semiconductors can not form insulating films by oxidation reaction. Accordingly, a gate insulating film, for example, is formed by sputtering or vapor-depositing of the oxide film of other elements, for instance $SiO_2$ or $Al_2O_3$. According to this method, however, since a material different from semiconductor layer material is vapor-deposited on the semiconductor layer, the interface is not uniform with the result that numerous trap levels are formed at the interface which trap electric charge, thus decreasing drain current, and degrading the characteristic of the interface between the gate insulating film and the semiconductor layer. This also degrades the reproduceability and uniformness of the element characteristics of the thin film transistors. To form a thin film transistor by using a binary compound semiconductor, a vacuum evaporation mask is used so that the accuracy of mask aligning is about 100 microns so that the width of a pattern formed through a vacuum evaporation mask is about 30 microns and the minimum width of the pattern becomes more than 30 microns. Therefore, it is impossible to increase the picture element density to a value higher than one line/mm when the transistors are combined with electroluminescent elements to fabricate a display device, thus making it difficult to obtain the display device of high density.

SUMMARY OF THE INVENTION

Accordingly, the principal object of this invention is to provide at a high reproduceability an improved AC drive type electroluminescent display device having a long life.

Another object of this invention is to provide a high density AC drive type electroluminescent display device.

Still another object of this invention is to provide an AC drive type electroluminescent display device capable of containing thin film transistors having a high breakdown voltage characteristic.

A further object of this invention is to provide a thin film transistor having a uniform characteristic and a high reproduceability which can be combined with an electroluminescent element so as to obtain a stable AC drive type electroluminescent display device.

Still further object of this invention is to provide an AC drive type electroluminescent display device capable of simplifying the construction of the thin film transistor and hence the manufacturing steps thereof.

To accomplish these and other objects, according to this invention, thin film transistors made of polycrystalline silicon are combined with an electroluminescent element, and the thin film transistors for driving the electroluminescent element are formed with offset regions between the source and gate electrodes and between the gate and drain electrodes, that is formed as a bidirectional offset construction.

According to this invention, there is provided an AC drive type electroluminescent display device comprising first and second thin film transistors formed on first and second portions of one surface of a transparent insulating substrate, each of which includes a first conductivity type channel region, said channel region comprising polycrystalline silicon with its crystal grain size increased, first and second impurity diffused regions of said first conductivity type and contiguously disposed on both sides of said channel region, a silicon gate oxide film formed on said channel region, a gate region overlying said silicon gate oxide film and made of polycrystalline silicon of a second conductivity type, a gate electrode, and first and second output electrodes which are formed on said gate electrode and said first and second impurity diffused regions respectively, an electroluminescent element formed on a third portion of said surface of said transparent insulating substrate, a capacitance element formed on a fourth portion of said surface of said transparent insulating substrate, means for connecting one electrode of said electroluminescent element to the first output electrode of said second transistor, means for connecting said second output electrode of said second transistor to a reference line, means for connecting said gate electrode of said second transistor to said second output electrode of said first transistor, means for connecting said second output electrode of said first transistor to said reference line through said capacitance element; means for connecting said gate electrode of said first transistor to a scanning line, means for connecting said first output electrode of said first transistor to a signal line, means for connecting the other electrode of said electroluminescent element to a source of alternating current, and means for forming offset gate regions between said gate region of said second transistor and said first and second impurity diffused layers.

BRIEF DESCRIPTION OF THE DRAWINGS

Further objects and advantages of the invention can be more fully understood from the following detailed description taken in conjunction with the accompanying drawings in which:

FIG. 2A is an enlarged sectional view showing the construction of a thin film transistor shown in FIG. 2;

DESCRIPTION OF THE PREFERRED EMBODIMENT

Figure 1:
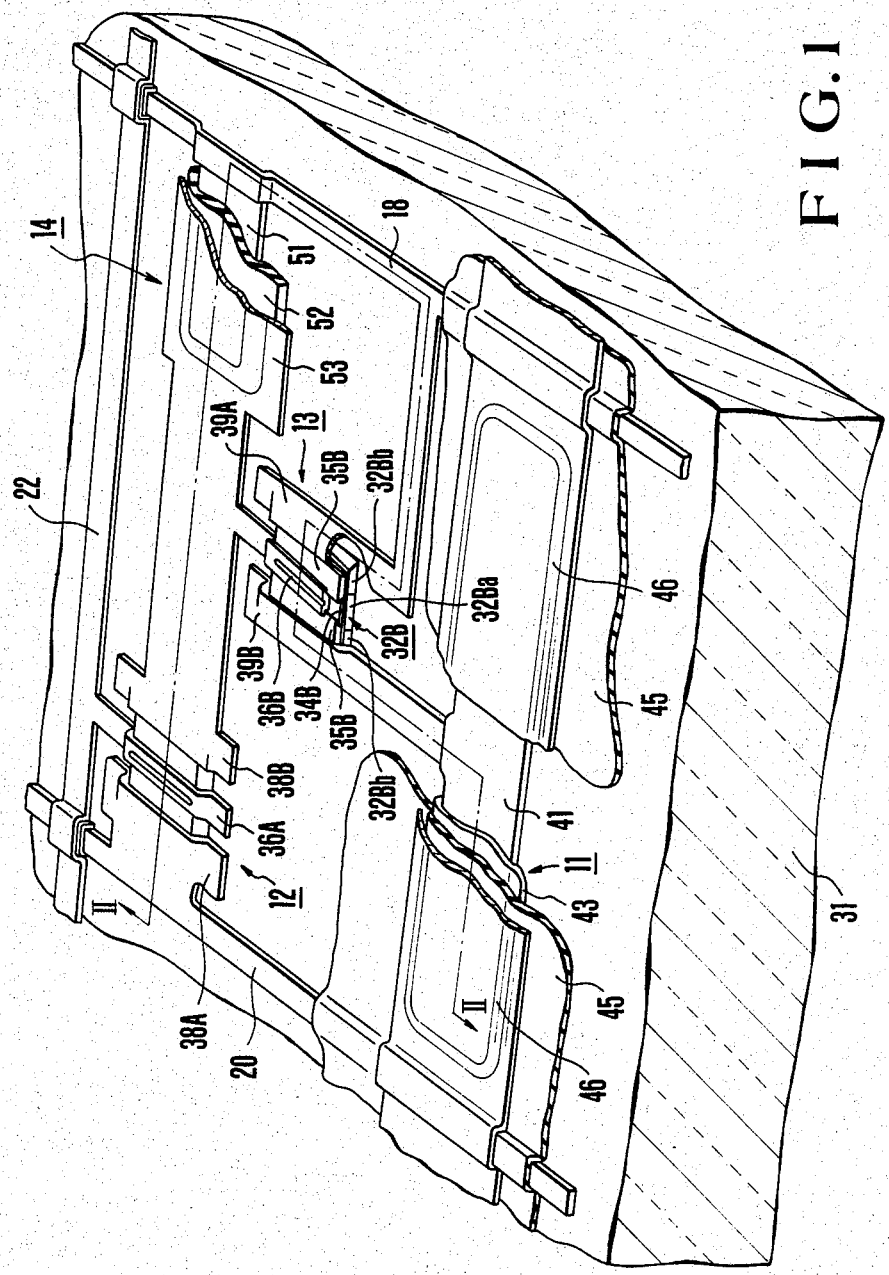
FIG. 1 is a perspective view showing one display cell of one embodiment of an AC drive type electroluminescent display device according to this invention.
Figure 2:
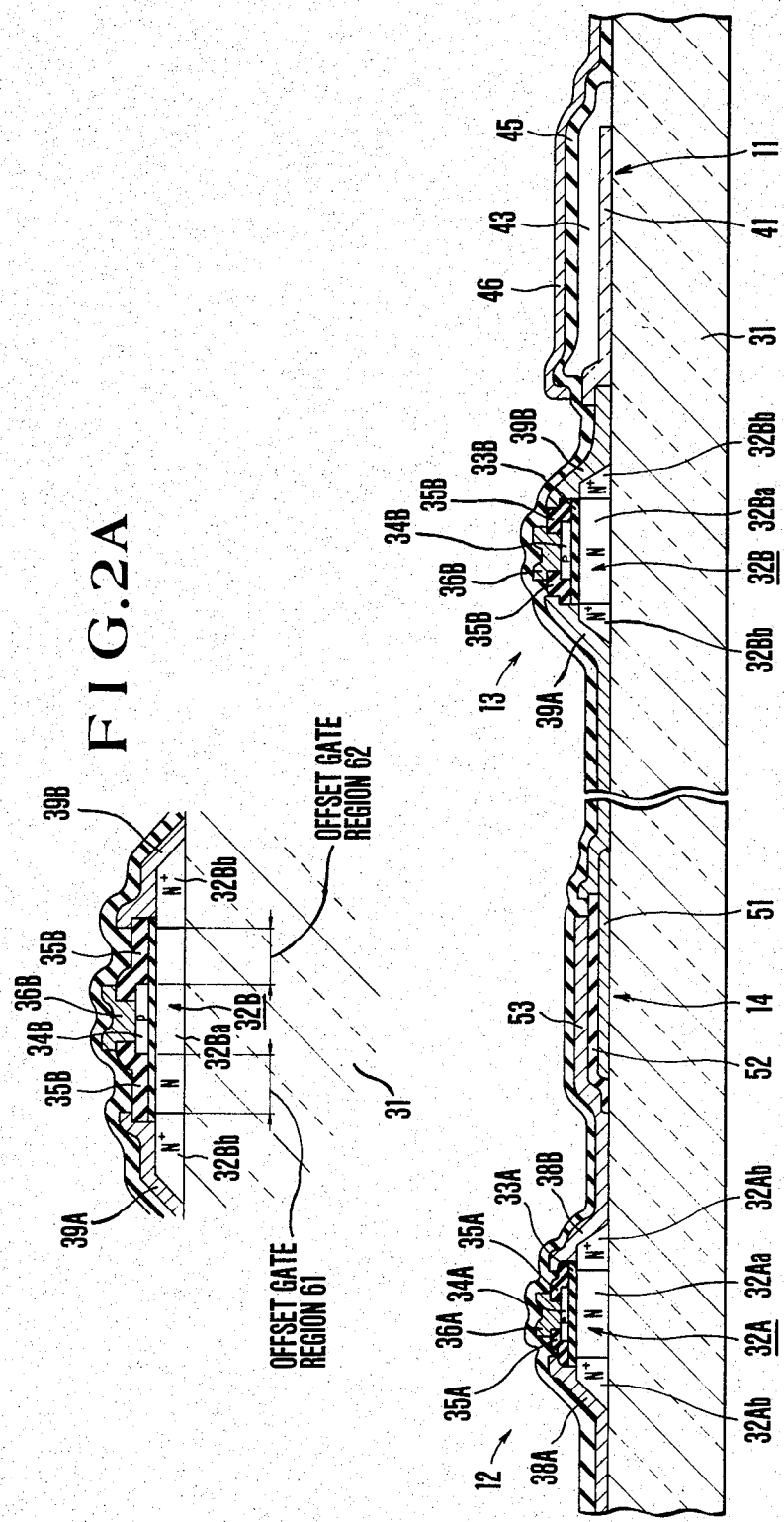
FIG. 2 is a sectional view taken along a line II—II in FIG. 1.
Figure 3:
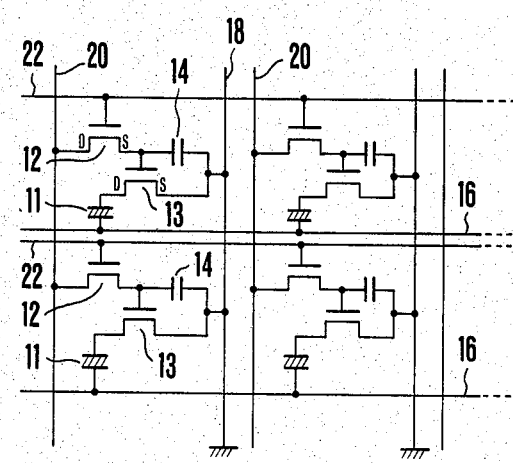
FIG. 3 is a connection diagram of the display device in which a plurality of the display cells shown in FIG. 1 are arranged in a matrix.

FIGS. 1, 2 and 3 show one embodiment of an AC drive type electroluminescent display device according to this invention, more particularly, a picture element display cell. The circuit construction of one picture element display cell utilized in this invention is shown in FIG. 3. As shown, each picture element display cell comprises an electroluminescent cell 11, two thin film transistors 12 and 13 utilizing polycrystalline silicon and a capacitor 14. One terminal of the electroluminescent cell 11 is connected to a power line 16, while the other terminal is connected to the drain electrode of the thin film transistor 13 of high breakdown voltage type. The gate electrode of the transistor 13 is connected to the source electrode of the thin film transistor 12, and the source electrode of the thin film transistor 13 is connected to a grounded line 18 acting as a common reference line. The drain electrode of the thin film transistor 12 is connected to a signal line 20 and the gate electrode is connected to a scanning line 22. The source electrode of the transistor 12 is connected to the gate electrode of the transistor 13 and to one terminal of the capacitor 14, the other terminal thereof being connected to the grounded line 18.

When a high level signal is applied to the scanning line 22, the thin film transistor 12 turns ON to charge the capacitor 14 by a current from the signal line 20. When the terminal voltage of the capacitor 14 becomes substantially equal to the voltage of the signal line 20, transistor 13 also turns ON. As a consequence, a drive circuit of the electroluminescent element 11 is formed between the power line 16 and the grounded line 18, whereby an AC voltage of ±70 V rms, for example, is impressed upon the electroluminescent element 11 from the power line 16 to cause the element 11 to emit. When the transistor 12 is turned OFF as a result of decreasing the voltage of the scanning line 22 below a predetermined value, the charge in the capacitor 14 maintains the transistor 13 in an ON state. During the ON state of the transistor 13 the electroluminescent element 11 continues to emit. When the high level signal is again applied to the scanning line 22 and a low level signal is applied to the signal line 20, the capacitor 14 is dischanged to disenergize the electroluminescent element 11.

Although this circuit construction per se is described in the reference referred to hereinabove, the invention is characterized by a novel combination of such circuit and the electroluminescent element as shown in FIGS. 1, 2 and 3. In FIG. 1, insulating films and protective films not important to understand the invention are omitted, and some of the elements directly related to this invention are partially shown so that the constructions shown in FIGS. 1 and 2 differ slightly.

As shown, spaced N type amorphous silicon or polycrystaline silicon layers 32A and 32B are formed on one surface of a transparent substrate 31. These silicon layers comprise channel regions 32Aa and 32Ba having a suitable resistivity and regions 32Ab and 32Bb diffused with an N type impurity at a high concentration and positioned on both sides of the channel regions 32Aa and 32Ba. Gate oxide films 33A and 33B made of SiO$_2$ are formed on the channel regions 32Aa and 32Ba of the silicon layers, and at the central portions of the gate oxide films 33A and 33B are disposed gate regions 34A and 34B formed by diffusing a P type impurity in the polycrystalline silicon. Insulating films 35A and 35B made of SiO$_2$ are formed on the gate regions 34A and 34B, and gate oxide films 33A and 33B. The insulating films 35A and 35B are perforated to receive electrodes 36A and 36B reaching the gate regions 34A and 34B. Source and drain electrodes 38A, 38B, 39A and 39B are disposed on the impurity diffused regions 32Ab and 32Bb in ohmic contact therewith. These source and drain electrodes are made of aluminum layers, for example. The channel region 32Aa, impurity diffused region 32Ab, gate oxide film 33A, gate region 34A, gate electrode 36A, drain electrode 38A and source electrode 38B constitute the thin film transistor 12 shown in FIG. 3, whereas the channel region 32Ba, impurity diffused region 32Bb, gate oxide film 33B, drain electrode 36B, drain electrode 39B, and source electrode 39A constitute the thin film transistor 13. An enlarged sectional structure of the transistor 13 is shown in FIG. 2A. Accordingly, the gate electrode 36A of transistor 12 is connected to the scanning line 22 and the drain electrode 38A is connected to the signal line 20, while the gate electrode 36B of transistor 13 is connected to the source electrode 38B of transistor 12 shown in FIG. 3.

A transparent electrode 41 connected to the drain electrode 39B of the transistor 13 is formed on the other portion of the upper surface of the glass substrate 31 and a vacuum evaporated electroluminescent film 43 consisting of an electroluminescent member essentially made of ZnS and doped with Mn acting as luminescent centers is formed on the transparent electrode 41. A source electrode 46 is disposed on the electroluminescent film 43 via an insulating film 45. The transparent electrode 41, vacuum evaporated film 43, insulating film 45, and the source electrode 46 constitute the electroluminescent element 11, and the source electrode 46 is connected to the power line 16.

As the insulating film 45, higher dielectric materials such as $Sm_2O_3$ and $Ta_2O_5$ etc. may be used. Mn used as the material for emitting the electroluminescent element 11 may be replaced by $TbF_3$, $SmF_3$, $ErF_3$, or other materials which are used for AC-driving the electroluminescent element. Further, between the transparent electrode 41 and electroluminescent film 43, an additional insulating film may be inserted to constitute the electroluminescent element 11. Also the electroluminescent element 11 may take other structures suitable for AC-driving the element 11.

An electrode 51 of a capacitor 14 consisting of polycrystalline silicon doped with a P type impurity which is the same as that used to form the gate regions of the thin film gate regions 34A and 34B of the thin film transistor is formed on the other portion of the upper surface of the glass substrate 31. An $SiO_2$ insulating film 52 is disposed on the electrode 51, and the other electrode 53 of the capacitor 14 is disposed on the insulating film 52. The electrode 51 is connected to the grounded line 18, while the electrode 53 is connected to the source electrode 38B of transistor 12 and to the gate electrode 36B of the transistor 13.

As above described, since the construction shown in FIGS. 1 and 2 is identical to well known construction shown in FIG. 3, it is considered unnecessary to describe its operation. However, it is to be noted that offset gate regions 61 and 62 are provided between the source and gate regions and between the gate and drain regions of the thin film transistor 13 as clearly shown in FIG. 2A. Preferably, these offset gate regions are symmetrically disposed on the opposite sides of each gate region in contiguous relation thereto and each gate region has a length of 5 microns, for example. It should be also noted that the offset gate regions of the transistor 12 may be omitted since no high voltage is applied to the transistor 12.

The construction described above has the following various advantages.

Figure 4:
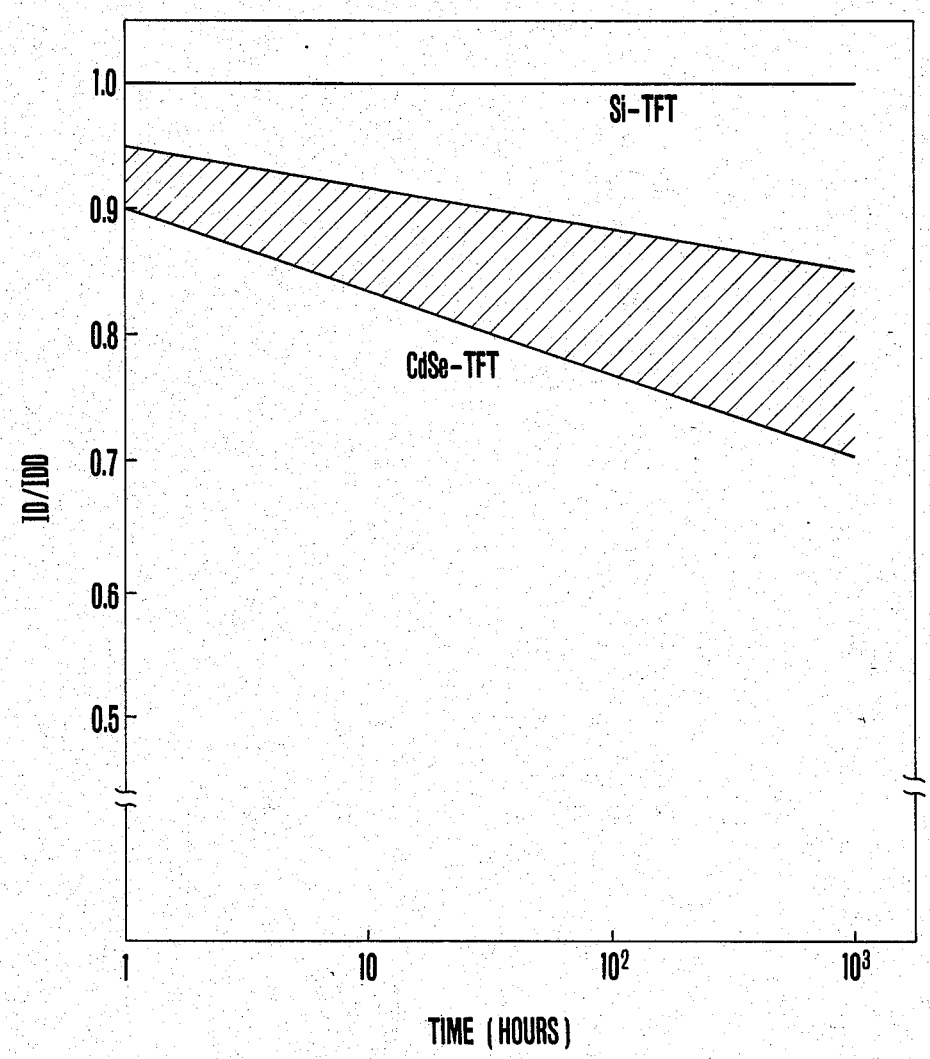
FIG. 4 shows ID/IOD—time characteristics of a CdSe thin film transistor and of a polycrystalline silicon thin film transistor embodying the invention.

(1) Since polycrystalline silicon is used for fabricating the thin film transistors that drive electroluminescent elements, nonuniformity of the characteristics, and instability in the operation inherent to the prior art transistors utilizing CdS or the like can be obviated, thus obtaining thin film transistors having stable characteristics over a long period. FIG. 4 shows variation with time between the initial drain current IOD and the normal drain current ID. As can be noted from FIG. 4, in the prior art thin film transistor utilizing CdSe, the drain current ID decreases with time as shown by a shaded portion, whereas in the thin film transistor of this invention utilizing polycrystalline silicon the drain current ID does not change in any appreciable extent in the measured period meaning a stable characteristic over a long period. As a consequence, it is possible to greatly elongate the useful life of the AC drive type electroluminescent display device. Since the polycrystalline silicon is an assembly of crystal grains there are many interfaces between the grains which are effective to increase the breakdown voltage of the thin film transistor as well as the mutual conductance.

(2) With the polycrystalline silicon it is possible to readily form an oxide film acting as an insulating film by a well known oxidation reaction. Thus, when a gate oxide film, for example, is made of the oxide film, the interface characteristic between the polycrystalline silicon and the gate oxide film can be stabilized so that the problems of reproduceability and nonuniformity inherent to the prior art transistor utilizing CdSe can be solved, thereby making uniform the characteristics of the thin film transistors.

Figure 5:
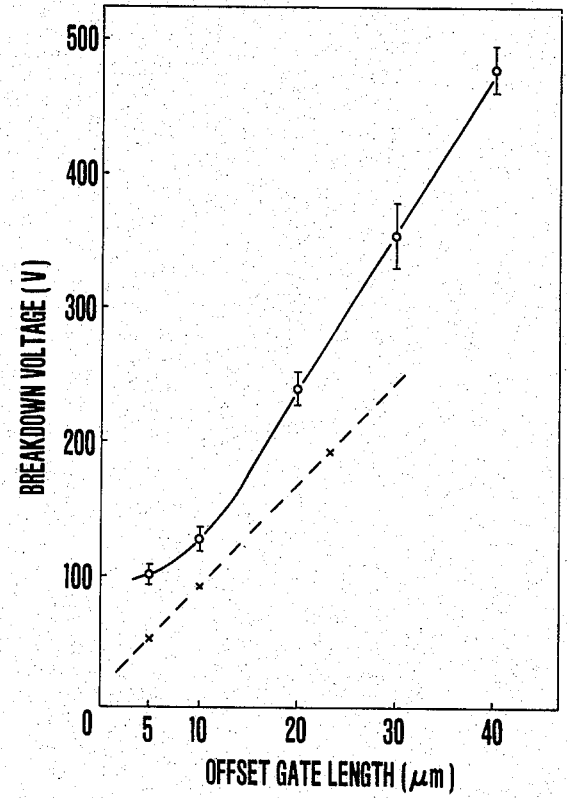
FIG. 5 is a graph showing a breakdown voltage-offset gate length characteristic of a polycrystalline silicon thin film transistor embodying the invention.
Figure 6:
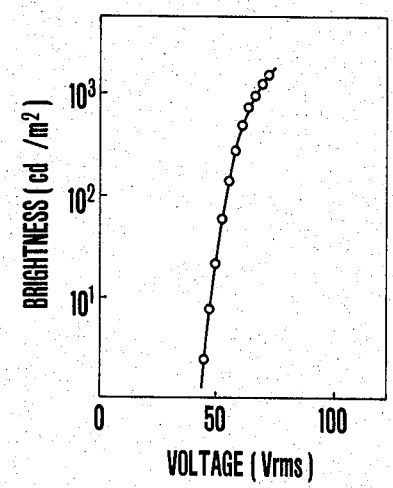
FIG. 6 is a graph showing the brightness-impressed voltage characteristic of an electroluminescent element.

(3) In the electroluminescent display device of this invention, since offset gate regions 61 and 62 having a predetermined length and acting as the source or drain regions of the transistors that drive the electroluminescent elements are formed between the impurity diffused layer 32B$b$ and the gate region 34B, the breakdown voltage of thin film transistor can be greatly increased. The relationship between the length of the offset region and the breakdown voltage is shown by FIG. 5 in which the ordinate represents the breakdown voltage and the abscissa the offset gate length in microns. The solid line shows the characteristic of this invention in which polycrystalline silicon is used for the channel regions, while dotted lines show a case utilizing monocrystalline silicon. As shown in FIG. 6, the electroluminescent element now being used does not illuminate or radiate unless an effective voltage of higher than about 40 V is applied. Considering the brightness, of about $10^3$ cd/m$^2$, in many cases, a voltage of about 70 Vrms is used. Accordingly, a practical device can be obtained by increasing the insulating strength to a value higher than 100 V by increasing the offset length to be longer than 5 microns by taking a sufficient safty margin into consideration. If it is desired to have higher breakdown voltage, the offset gate length is increased. On the other hand, where the electroluminescent element material is improved thus permitting use of the thin film transistors having lower breakdown voltage, the offset gate length can be decreased.

Supposing a case wherein the channel region is made of monocrystalline silicon, the following discussion will be made. When monocrystalline silicon is used for the purpose of obtaining a breakdown voltage higher than 100 V it is essential to increase the offset gate length to more than 15 microns. This means that it is necessary to increase the length of the offset gate length than a case utilizing polycrystalline silicon to obtain the same breakdown voltage. Thus, the thin film transistor utilizing polycrystalline silicon can be miniaturized than that utilizing monocrystalline silicon.

(4) In the electroluminescent display device according to this invention, since the thin film transistors that drive the electroluminescent elements are subjected to a laser beam annealing treatment for increasing crystal size, the interface characteristic is improved further which also contributes to the desired result of obtaining a stable electroluminescent display device. More particularly, the polycrystalline silicon comprises an assembly of elongated crystals extending in the direction of x (a direction interconnecting the source and drain electrodes), for example. The mobility of carriers in the crystal grains is substantially the same as that in monocrystalline silicon. Moreover, since the crystal grains are long in the direction of x, although the mobility decreases more or less at the grain interfaces, it is possible to obtain a carrier mobility close to that of monocrystalline silicon. In the polycrystalline silicon fabricated in a conventional manner, as the crystal grains are extremely small and present numerously, the number of traps is increased, thus tending to degrade the interface characteristic. To prevent this tendency, according to this invention, above described laser beam annealing treatment is used which causes the crystal grains to grow, thus improving the interface characteristic caused by the decrease in the number of traps.

Figure 7:
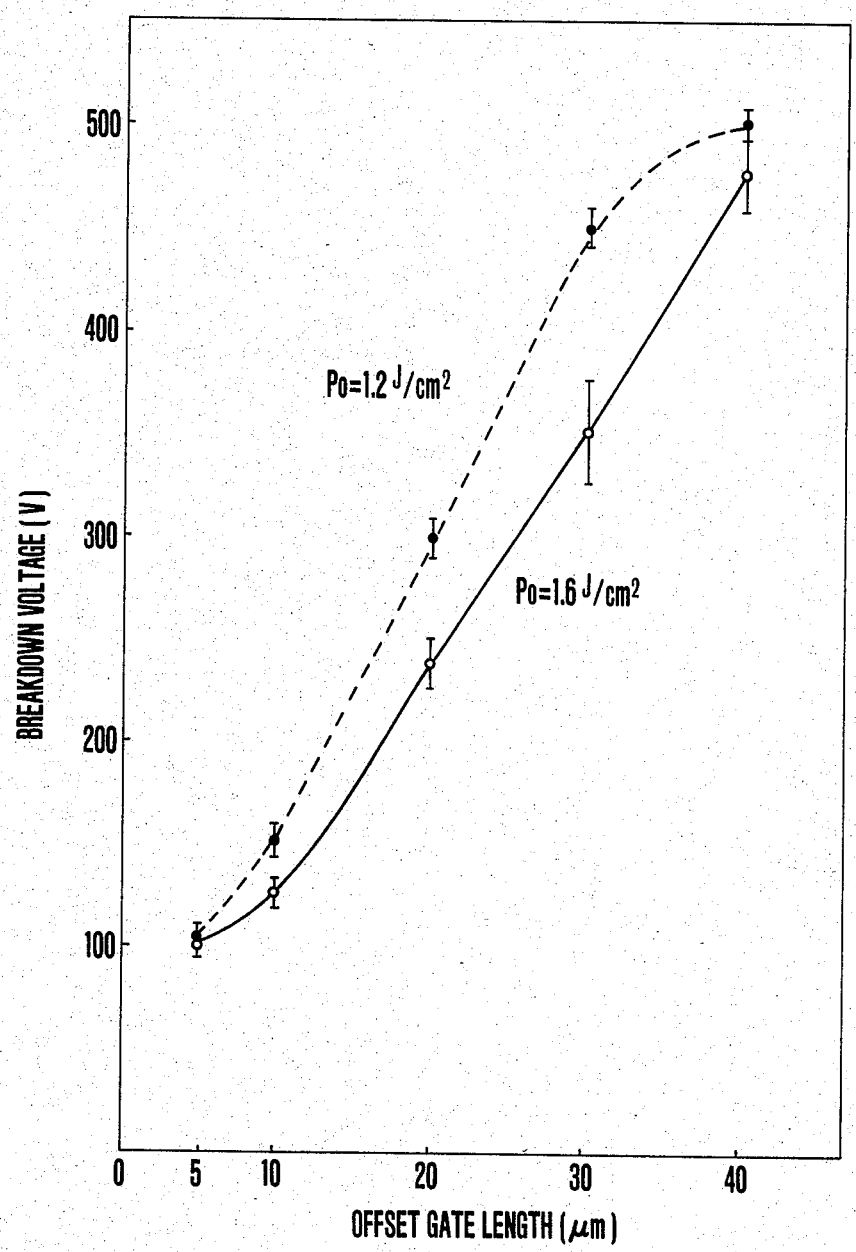
FIG. 7 is a graph showing the breakdown voltage-offset length characteristic at the time of annealing taking laser power variation as a parameter.

FIG. 7 shows the relationship between the offset gate length and the element insulating strength when the laser power Po is varied at the time of laser annealing. As shown in FIG. 7, where the laser power is increased, the breakdown voltage with respect to the offset gate length slightly increases, but near a range in which the offset gate length is 5 microns as described above the breakdown voltage is substantially constant irrespective of the magnitude of the laser power. This shows that near the offset gate length of about 5 microns now being used, slight variation in the laser power does not cause any variation in the breakdown voltage thereby providing a thin film transistor having uniform characteristics.

(5) In the electroluminescent display device of this invention, since the thin film transistors for driving the electroluminescent elements are made of polycrystalline silicon it is possible to use a method of preparing conventional elements utilizing a monocrystalline silicon substrate. Thus, the channel length of the thin film transistors may be about 3 to 5 microns, and the width of the elements may be about 20 microns. Also the size of the capacitor can be reduced even with the conventional method, whereby the picture element density can be increased to 4 lines/mm, which is four times the density of the prior art.

One example of a method of manufacturing a thin film transistor utilized in the display device of this invention will now be described.

Figure 8A:
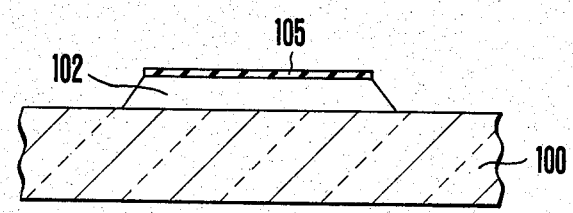
FIGS. 8A, 8B and 8C are sectional views showing steps of one example of the method of manufacturing a polycrystalline silicon thin film transistor embodying the invention.

At first a silicon film 102 having a thickness of 0.5 micron is deposited on a glass substrate 100 with reduced pressure CVD method using SiH$_4$ Pyrolysis at a temperature 580° C. for about 37 minutes as shown in FIG. 8A.

Then ions of phosphor, an N type impurity, are implanted into the film 102 at an implantation voltage of 150 KV to a concentration of $3 \times 10^{12}$/cm$^2$. Then the assembly is annealed for 30 minutes at a temperature of 900° C. Then, the film 102 is annealed by using the second harmonic of a laser beam having a diameter of 85 microns, a wavelength of 0.53 micron and a power of 1.6 Joules/cm$^2$ generated by a YAG laser. The irradiation of the laser beam is firstly made in the direction x (horizontal direction in FIG. 8A) at a scanning speed of 100 mm/sec. and then in the direction y (perpendicular to the sheet of drawing). When the laser beam is irradiated in two directions, the crystals of the polycrystalline silicon grow in the direction of x at the first irradiation in the x direction but the crystals are not caused to grow by the irradiation in the direction of y. For example, under the above described conditions of the laser beam annealing, the crystal grains grown in the direction x have a length of about 10 microns, while the width of the grains grown in the direction y is only one micron. As above described, the laser beam annealing is effected for the purpose of growing crystal grains and electrically activating them. The laser beam irradiation of the film 102 is not limited to the portion to become a channel region but portions on both sides of the channel region are also irradiated.

Then the assembly is heated in dry oxygen for 90 minutes at a temperature of 1100° C. for forming an SiO$_2$ gate oxide film 105 having a thickness of 1500 angstroms on the film 102. Then the film 102 and the gate oxide film 105 are worked to have predetermined patterns by photolithography and plasma etching in CF$_4$ gas.

Figure 8B:
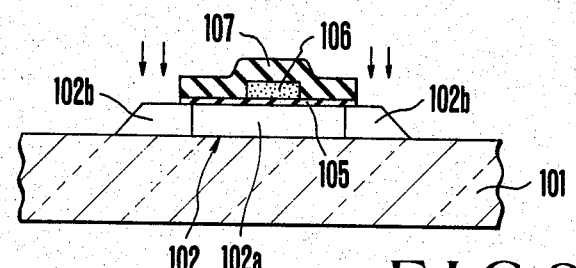

Then as shown in FIG. 8B, a layer of polycrystalline silicon having a thickness of 0.3 micron is formed on the gate oxide film and then the ions of boron acting as a P type impurity are implanted under an implantation voltage of 30 KV to create a concentration of $3 \times 10^{15}$/cm$^2$. Thereafter the assembly is annealed for 15 minutes to form a gate region 106. Then a SiO$_2$ insulating film 107 is deposited on the gate region 106 by CVD method and portions to form source and drain regions are removed by photolithography and etching techniques. Then ions of arsenic acting as an N type impurity are implanted into the film 102 under an implantation voltage of 100 KV to obtain a high concentration of $2 \times 10^{16}$/cm$^3$ and annealed for 30 minutes at 900° C. to form impurity diffused layers 102b utilized as source and drain regions. A portion between the impurity diffused layers 102b of the film 102 forms a channel region 102a.

Figure 8C:
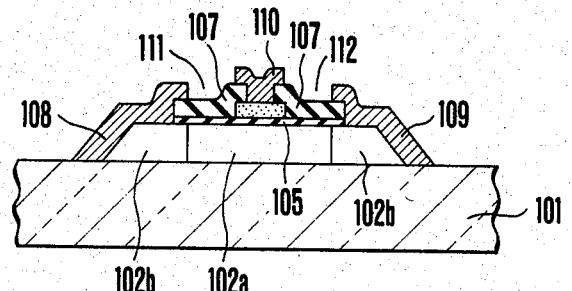

Thereafter, as shown in FIG. 8C, a window is formed through the insulating film 107 at a portion corresponding to the gate region 106 by photolithography and etching techniques. Then an aluminum layer is deposited with an electron beam to a thickness of 8000 angstroms. Then the aluminum layer is worked accordingly to a predetermined pattern to form electrodes 108, 109 and 110.

Figure 9:
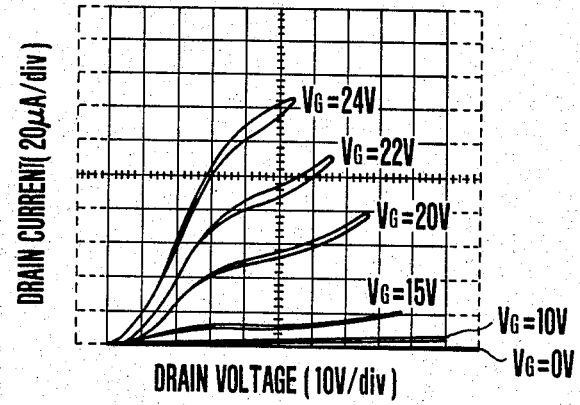
FIG. 9 shows the drain current—drain voltage characteristics of the resulting thin film transistor.

FIG. 9 shows a drain current-drain voltage characteristic of a thin film transistor taking the gate voltage as a parameter. The offset gate length of the transistor is 5 microns, the channel length is 10 microns, the channel width is 100 microns, and the laser anneal power is 1.6 J/cm$^2$. The breakdown voltage of the transistor is higher than 100 V, its mutual conductance is 25μS, and the threshold voltage is 8 V. It should be noted that where the source-channel-drain region of the thinfilm transistor 13 is an N$^{30}$-N-N$^+$ structure, the breakdown voltage of the thin film transistor is higher than that of the thin film transistor having an N$^+$-P-N$^+$ structure. This is the reason why, where the polycrystalline silicon is used, the breakdown voltage of the P-N junction becomes lower.

Figure 10A:
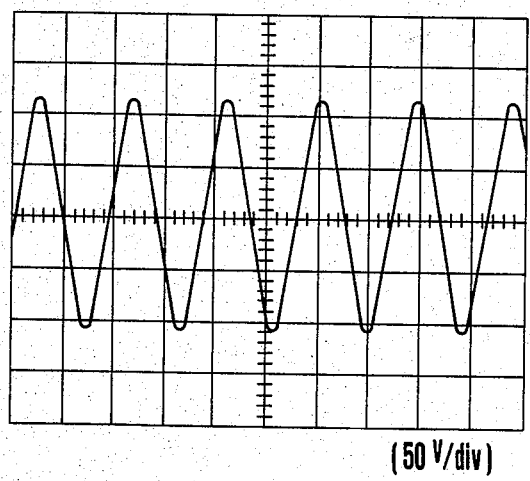
FIGS. 10A and 10B show the waveform of the source voltage and the waveforms at the time of ON-OFF operation of an electroluminescent element.
Figure 10B:
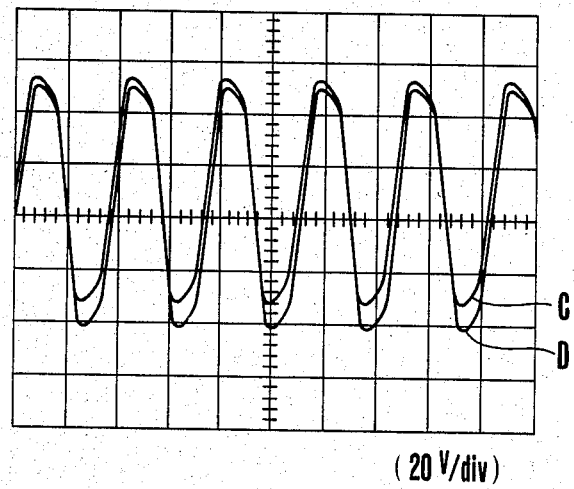

After assembling an electroluminescent display device including a display cell as shown in FIG. 3 by combining the aforementioned thin film transistor and an electroluminescent element, a source voltage having a waveform as shown in FIG. 10A is impressed upon the source line 16. Then the terminal voltage waveform of the electroluminescent element becomes as shown in FIG. 10B, in which a waveform C shows the waveform of the electroluminescent element when its drive transistor is OFF, while D shows the waveform when the transistor is ON. As can be noted from these waveforms, according to this invention it is possible to provide a novel electroluminescent display apparatus in which electroluminescent elements can be positively driven.

It should be understood that the invention is not limited to the specific embodiment described above and that various changes and modifications will be obvious to one skilled in the art. For example, the conductivity type of the gate regions of a transistor for driving an electroluminescent element and a switching transistor for the first mentioned transistor may be of P type.

What is claimed is:

1. An AC drive type electroluminescent display device comprising:

first and second thin film transistors formed on first and second portions of one surface of a transparent insulating substrate, each of which includes a first conductivity type channel region, said channel region comprising polycrystalline silicon with its crystal grain size increased, first and second impurity diffused regions of said first conductivity type and contiguously disposed on both sides of said channel region, a silicon gate oxide film formed on said channel region, a gate region overlying said silicon gate oxide film and made of polycrystalline silicon of a second conductivity type, a gate electrode, and first and second output electrodes which are formed on said gate electrode and said first and second impurity diffused regions;

said second transistor including a first offset gate region located between said gate region and said first impurity diffused region and a second offset gate region located between said gate region and said second impurity diffused region, said first and second offset gate regions being located in said polycrystalline channel region of said second transducer;

an electroluminescent element formed on a third portion of said surface of said transparent insulating substrate;

a capacitance element formed on a fourth portion of said surface of said transparent insulating substrate;

means for connecting one electrode of said electroluminescent element to the first output electrode of said second transistor;

means for connecting said second output electrode of said second transistor to a reference line;

means for connecting said gate electrode of said second transistor to said second output electrode of said first transistor;

means for connecting said second output electrode of said first transistor to a scanning line;

means for connecting said first output electrode of said first transistor to a signal line; and means for connecting the other elements of said electroluminescent element to a source of alternating current.

2. The display device according to claim 1 wherein each one of said offset regions has a length larger than 5 microns.

3. The display device according to claim 1 wherein said first conductivity type is N type and said second conductivity type is P type.

4. The display device according to claim 1 wherein said reference line is grounded.

5. The display device according to claim 1 wherein said electroluminescent element comprises:

a transparent electrode formed on the third portion of said transparent insulating substrate;

an electroluminescent member disposed on said transparent electrode;

an insulating layer disposed on said electroluminescent member; and another electrode disposed on said last insulating layer.

6. The display device according to claim 5 which further comprises another insulating layer disposed between said transparent electrode and said electroluminescent member.

7. The display device according to claim 1 wherein said electroluminescent member consists essentially of ZnS doped with an impurity selected from the group consisting of Mn, $TbF_3$, $SmF_3$ and $ErF_3$.

8. The display device according to claim 1 wherein said transparent insulating substrate comprises a glass sheet.

* * * * *